US006619359B2

(12) United States Patent
Ballard et al.

(10) Patent No.: US 6,619,359 B2
(45) Date of Patent: Sep. 16, 2003

(54) PELLICLE MOUNTING APPARATUS

(75) Inventors: Shane P. Ballard, Erie, CO (US);
Robert J. Viola, Boulder, CO (US);
Carl E. Merkel, Thornton, CO (US);
Robert Teissler, Longmont, CO (US)

(73) Assignee: Brooks Automation, Inc., Chelmsford, MA (US)

( * ) Notice: Subject to any disclaimer, the term of this patent is extended or adjusted under 35 U.S.C. 154(b) by 85 days.

(21) Appl. No.: 09/788,034

(22) Filed: Feb. 16, 2001

(65) Prior Publication Data

US 2002/0112824 A1 Aug. 22, 2002

(51) Int. Cl.[7] .............................................. G03B 27/62
(52) U.S. Cl. ....................... 156/366; 156/494; 156/556; 156/581; 355/74
(58) Field of Search ................................ 156/366, 494, 156/556, 580, 581; 355/74

(56) References Cited

U.S. PATENT DOCUMENTS

| 4,443,098 A | 4/1984 | Walwyn et al. ................ 355/74 |
| 4,637,713 A | 1/1987 | Shulenberger et al. ........ 355/76 |
| 5,311,250 A | 5/1994 | Suzuki et al. ................. 355/76 |
| 5,772,817 A | 6/1998 | Yen et al. .................... 156/73.1 |
| 5,888,327 A | 3/1999 | Akagawa et al. ............. 156/64 |
| 5,953,107 A * | 9/1999 | Li et al. ........................ 355/77 |
| 6,317,197 B1 * | 11/2001 | Li et al. ........................ 355/74 |

OTHER PUBLICATIONS

Micro Lithography, Inc. "Mounting Package," WWW.M-LIUSA.COM/WEBSITE/GIFS/Mountmachine Slide.JPG.

* cited by examiner

Primary Examiner—James Sells
(74) Attorney, Agent, or Firm—Perman & Green, LLP; Richard Pickreign

(57) ABSTRACT

The invention features an apparatus for mounting a pellicle to a reticle. The apparatus includes: a base; a first holder coupled to the base and including two edges positioned to support a first object below its center of gravity and secure the first object in substantially vertical alignment with the base, the first object including one of the pellicle and the reticle; a second holder slidably coupled to the base and including two edges positioned to support a second object below its center of gravity and secure the second object in substantially vertical alignment with the base, the second object including the other of the pellicle and the reticle; and a pressure applicator assembly slidably coupled to the base to adjustably apply pressure to a periphery of the second object held in the second holder and drive it against a corresponding periphery of the first object held in the first holder. In additional embodiments, the apparatus provides automated mounted of the pellicle and reticle.

25 Claims, 11 Drawing Sheets

PELLICLE MOUNTING APPARATUS

TECHNICAL FIELD

This invention relates to a pellicle mounting apparatus.

BACKGROUND

A reticle plate, usually made of glass or quartz, can be used as a mask as part of the process of producing various semiconductor devices such as integrated circuits. If any dust or particles fall onto the surface of the mask, this will produce an inaccurate reproduction from the mask including spots representing the dust or particles. To protect the mask from dust or other particles, a pellicle (which consists of a thin transparent membrane) is positioned adjacent to and spaced from the mask so that any dust or other particles will fall onto the membrane rather than the mask. Thus, the dust and other particles will be out of focus when the mask is used.

Pellicles are generally formed with a frame member supporting the periphery of the membrane. The frame member is attached to the reticle by an adhesive so that the membrane is maintained in a fixed relationship with the mask. The frame member itself is extremely fragile and susceptible to damage or distortion by any direct pressure or flexing of the pellicle.

A pellicle frame tray, such as a MicroLithography Inc. Pellicle Tray (Part Number "CAN34P0061"), is often used in assembling a reticle to a framed pellicle. The use of the tray provides some additional reinforcement of the pellicle frame member during assembly.

SUMMARY

In general, in one aspect, the invention features an apparatus for mounting a pellicle to a reticle. The apparatus includes: a base; a first holder coupled to the base and including two edges positioned to support a first object below its center of gravity and secure the first object in substantially vertical alignment with the base, the first object including one of the pellicle and the reticle; a second holder slidably coupled to the base and including two edges positioned to support a second object below its center of gravity and secure the second object in substantially vertical alignment with the base, the second object including the other of the pellicle and the reticle; and a pressure applicator assembly slidably coupled to the base to adjustably apply pressure to a periphery of the second object held in the second holder and drive it against a corresponding periphery of the first object held in the first holder.

In some embodiments, the apparatus further includes a bi-directional actuator coupled to the pressure applicator assembly to drive and retract the pressure applicator assembly in relation to the base. For example, during operation the actuator can drive the pressure applicator assembly against the second object to cause the second holder to slide towards the first holder.

In general, in another aspect, the invention features an automated apparatus for mounting a pellicle to a reticle. The apparatus includes: a base; a first holder coupled to the base and positioned to support a first object in substantially vertical alignment to the base, the first object including one of the pellicle and the reticle, the first holder including at least one sensor for determining the presence or absence of the first object in the first holder; a second holder slidably coupled to the base and positioned to support a second object in substantially vertical alignment with the base, the second object including the other of the pellicle and the reticle, the second holder including at least one sensor for determining the presence or absence of the second object in the second holder; a pressure applicator assembly slidably coupled to the base to adjustably apply pressure to a periphery of the second object held in the second holder and drive it against a corresponding periphery of the first object held in the first holder; and an actuator coupled to the pressure applicator assembly and responsive to the sensors in the first and second holder to drive the pressure applicator assembly towards the first holder for a time interval when the first and second object are in the first and second holders.

For example, the sensors can include retroflective light sensors or mechanical sensors. In some embodiments, a user sets the time interval. Alternatively, a controller coupled to the actuator can set the time interval in an automated fashion. Furthermore, during operation the actuator can retract the pressure applicator assembly away from the first holder after the time interval.

In general, in another aspect, the invention features an apparatus for mounting a pellicle to a reticle. The apparatus includes: a base; a first holder coupled to the base and positioned to support a first object in substantially vertical alignment to the base, the first object including one of the pellicle and the reticle; a second holder slidably coupled to the base and positioned to support a second object in substantially vertical alignment with the base, the second object including the other of the pellicle and the reticle; and a pressure applicator assembly slidably coupled to the base to adjustably apply pressure to a periphery of the second object held in the second holder and drive it against a corresponding periphery of the first object in the first holder. The pressure applicator assembly includes: a slidable bracket coupled to the base; a back plate rigidly attached to the slidable bracket; an intermediate plate pivotally coupled to the back plate along at least one axis; and a front plate pivotally coupled to the intermediate plate along at least one other axis, the front plate having a plurality of contact points configured to align with the periphery of the second object held in the second holder.

In some embodiments, the pressure applicator assembly further includes a first at least one tensioning device positioned to apply tension to the pivotal coupling between the back plate and the intermediate plate, and a second at least one tensioning device positioned to apply tension to the pivotal coupling between the front plate and the intermediate plate. For example, the first and second tensioning devices can include a plurality of springs.

In general, in another aspect, the invention features an apparatus for mounting a pellicle to a reticle. The apparatus includes: a base; a first holder coupled to the base and positioned to support a first object in substantially vertical alignment to the base, the first object including one of the pellicle and the reticle; a second holder slidably coupled to the base and positioned to support a second object in substantially vertical alignment with the base, the second object including the other of the pellicle and the reticle; a pressure applicator assembly slidably coupled to the base to adjustably apply pressure to a periphery of the second object held in the second holder and drive it against a corresponding periphery of the first object held in the first holder; and a laminar air flow source configured to provide air flow along the substantially vertically aligned first and second objects.

Embodiments of any of the different aspects of the invention described above can include any of the following features.

The pressure applicator assembly can be configured to adjust to the orientation of the periphery of the second object and apply uniform pressure to the periphery of the second object.

The first object can include a pellicle tray supporting the pellicle. Alternatively, the first object can be the pellicle, e.g., a framed pellicle. Furthermore, the pellicle can include an adhesive along the periphery of one of its faces.

The first holder can be rigidly coupled to the base and include a backing plate positioned to support a back periphery of the first object. Moreover, the first holder can further include: an upright bracket coupled to the base; and a translation frame rigidly coupled to the upright bracket and to the backing plate, the translation frame configured to allow adjustment of the backing plate in a substantially vertical plane relative to the base. Alternatively, the first holder can be slidably coupled to the base, and the apparatus can further includes a backing plate rigidly secured to the base and extending substantially vertically from the base, wherein the backing plate is configured to support a back periphery of the first object.

The actuator can be a bi-directional cylinder, e.g., a pneumatic cylinder, configured to drive the pressure applicator assembly towards the first holder and alternately to retract the pressure applicator assembly away from the first holder.

The apparatus can further include a shock absorber coupled to at least one of the pressure applicator and the second holder and positioned between the pressure applicator and the second holder. Moreover, the apparatus can further include a shock absorber coupled to at least one of the first holder and the second holder and positioned between the first holder and the second holder.

Embodiments of the invention may include many advantages.

For example, the apparatus can allow mounting of a framed pellicle to a reticle with minimal distortion or damage to the individual or completely assembled parts. The reticle holder and pellicle tray holder both utilize support edges that provide support below their center of gravity, thus the reticle and pellicle are supported vertically without mechanical or pneumatic pressure. Furthermore, the pressure applicator can uniformly apply pressure to the periphery of the reticle and pellicle during assembly. Moreover, the apparatus can also provide for integrated laminar airflow to remove contaminants during mounting and assembly.

Furthermore, embodiments of the apparatus can be automated to provide highly accurate alignment of the framed pellicle to the reticle over repeated mountings. Also, the use of a pellicle tray can accommodate the use of different sized pellicle frames.

Other features, objects, and advantages of an embodiment will be apparent from the following description and drawings, and from the claims.

DESCRIPTION OF DRAWINGS

Like reference symbols in the various drawings indicate like elements.

DETAILED DESCRIPTION

Figure 1:
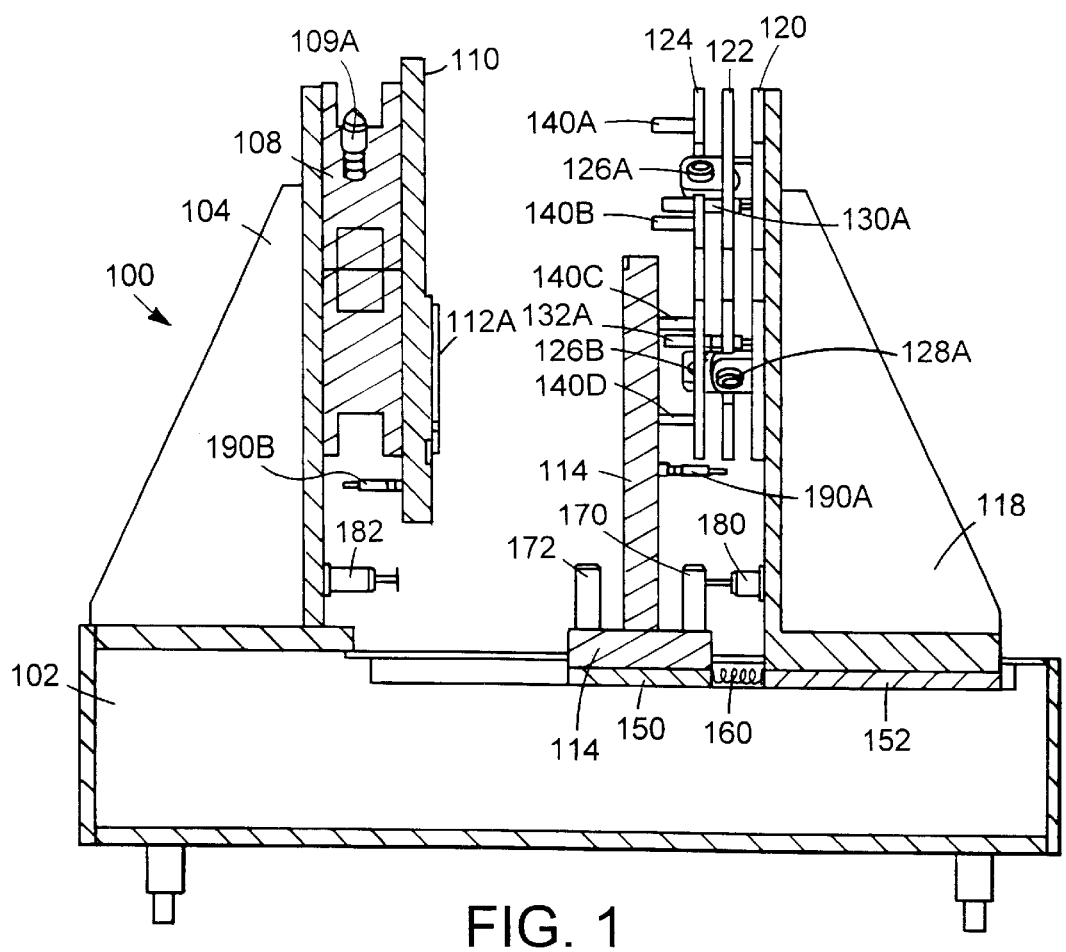
FIG. 1 is a sectional view of an embodiment.
Figure 4:
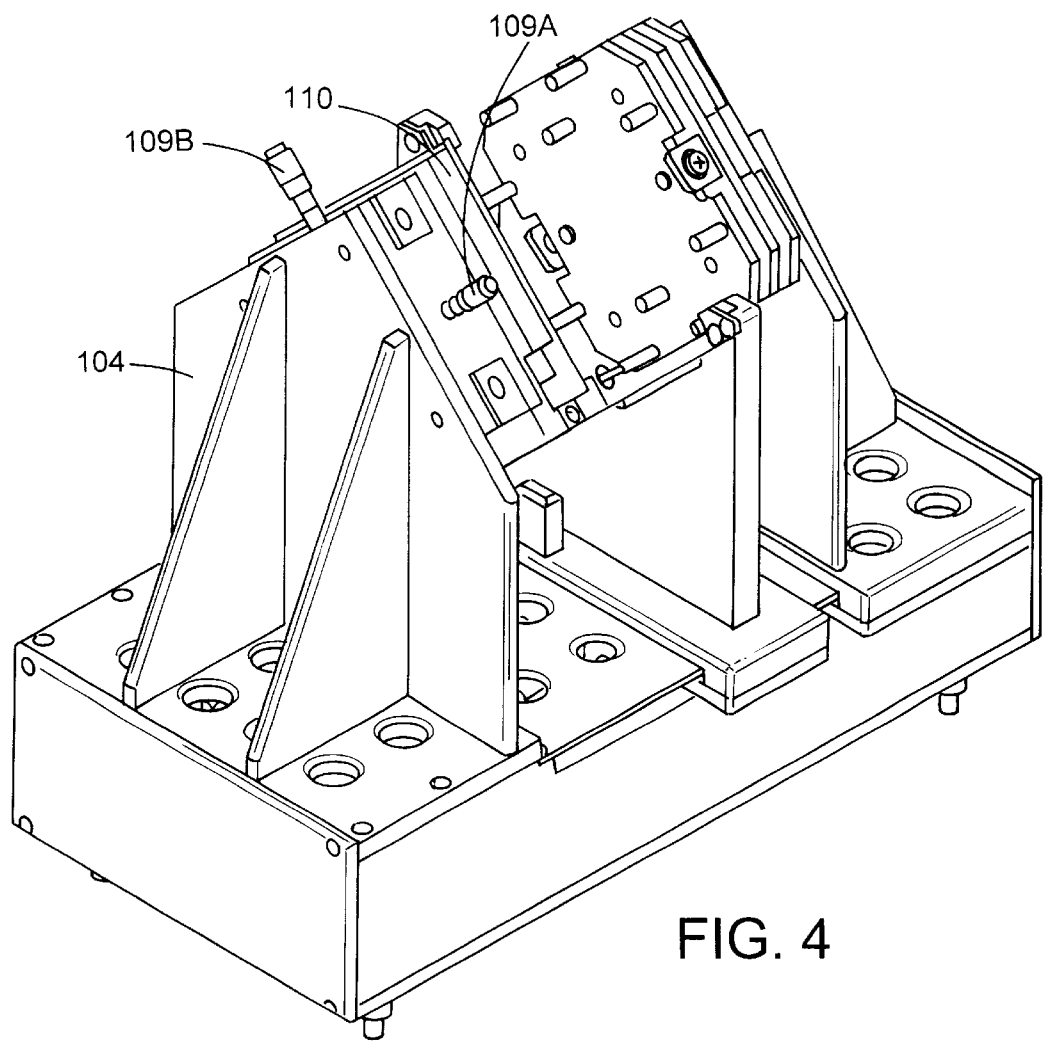
FIG. 4 is a side-angle view of an embodiment.

Referring to FIG. 1, in an embodiment of a pellicle mounting apparatus 100 includes a pellicle holder brace 104 fixed to a base frame 102. An adjustable translation stage 108 is attached to the upright portion of pellicle holder brace 104. Pellicle tray holder plate 110 is attached to the face of adjustable translation stage 108. Referring to FIG. 4 and FIG. 1, adjustment means 109A,109B allow the pellicle tray holder plate 110 to be translated relative to the upright portion of pellicle holder brace 104, in the two planes parallel to the upright portion of pellicle holder brace 104.

Figure 2:
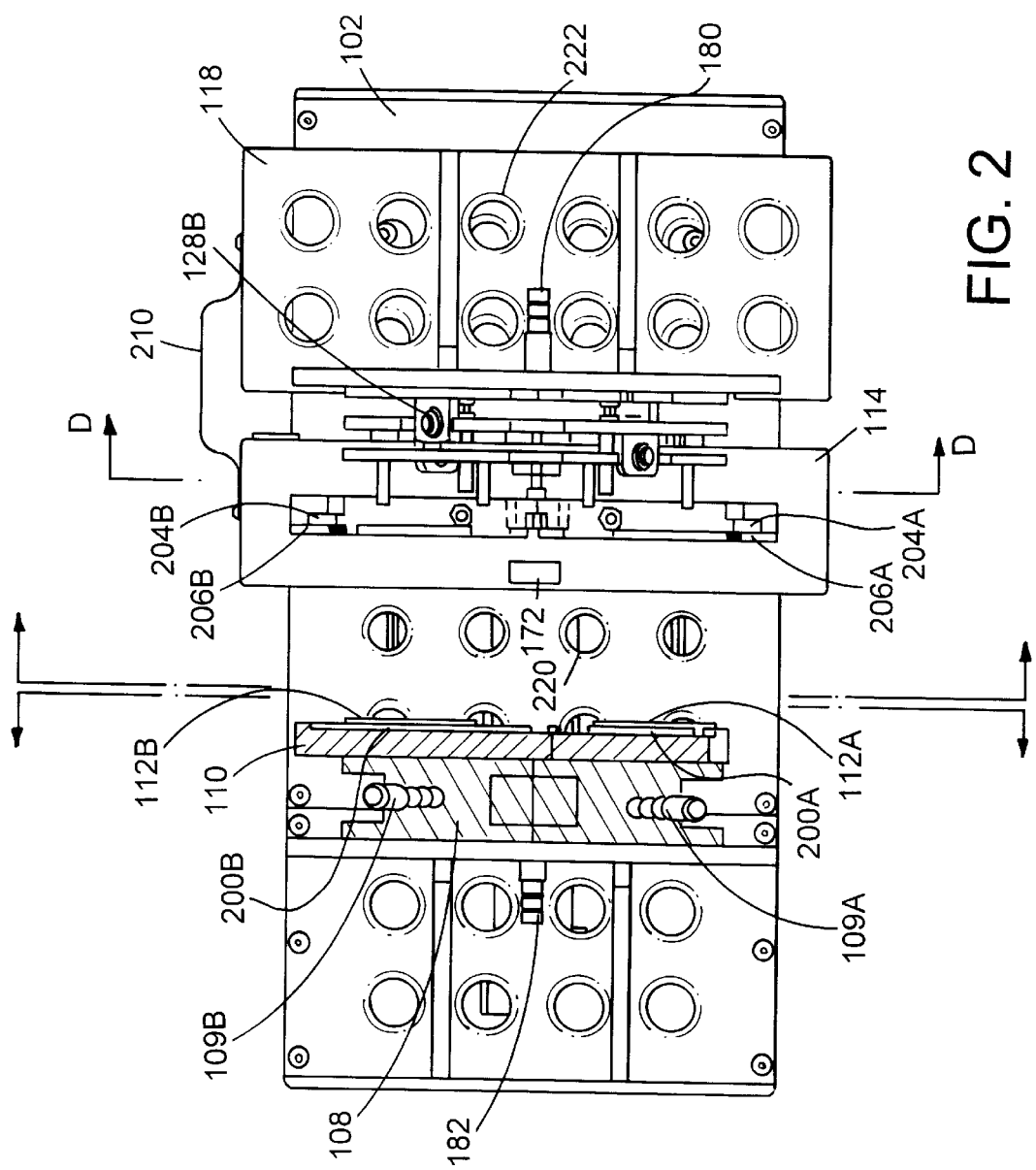
FIG. 2 is an overhead sectional view of an embodiment.

Referring again to FIG. 1, a pressure applicator brace 118 includes three pressure adjustment plates: a back plate 120, a middle plate 122, and a front plate 124. Back plate 120 is rigidly attached to the pressure applicator brace 118. Referring to FIG. 2 and FIG. 1, middle plate 122 is attached with two pivot pins 128A,128B to back plate 120. Pivot pins 128A,128B allow middle plate 122 to tilt in one axis relative to the upright portion of pressure applicator brace 118 and a reticle holder 114. Front plate 124 is attached with two pivot pins 126A,126B to middle plate 122. Pivot pins 126A,126B allow front plate 124 to tilt in another axis relative to the upright section of pressure applicator brace 118 and reticle holder 114. In a preferred embodiment, the front plate tilt axis is approximately 90 degrees away from the tilt axis of middle plate 122.

Figure 3:
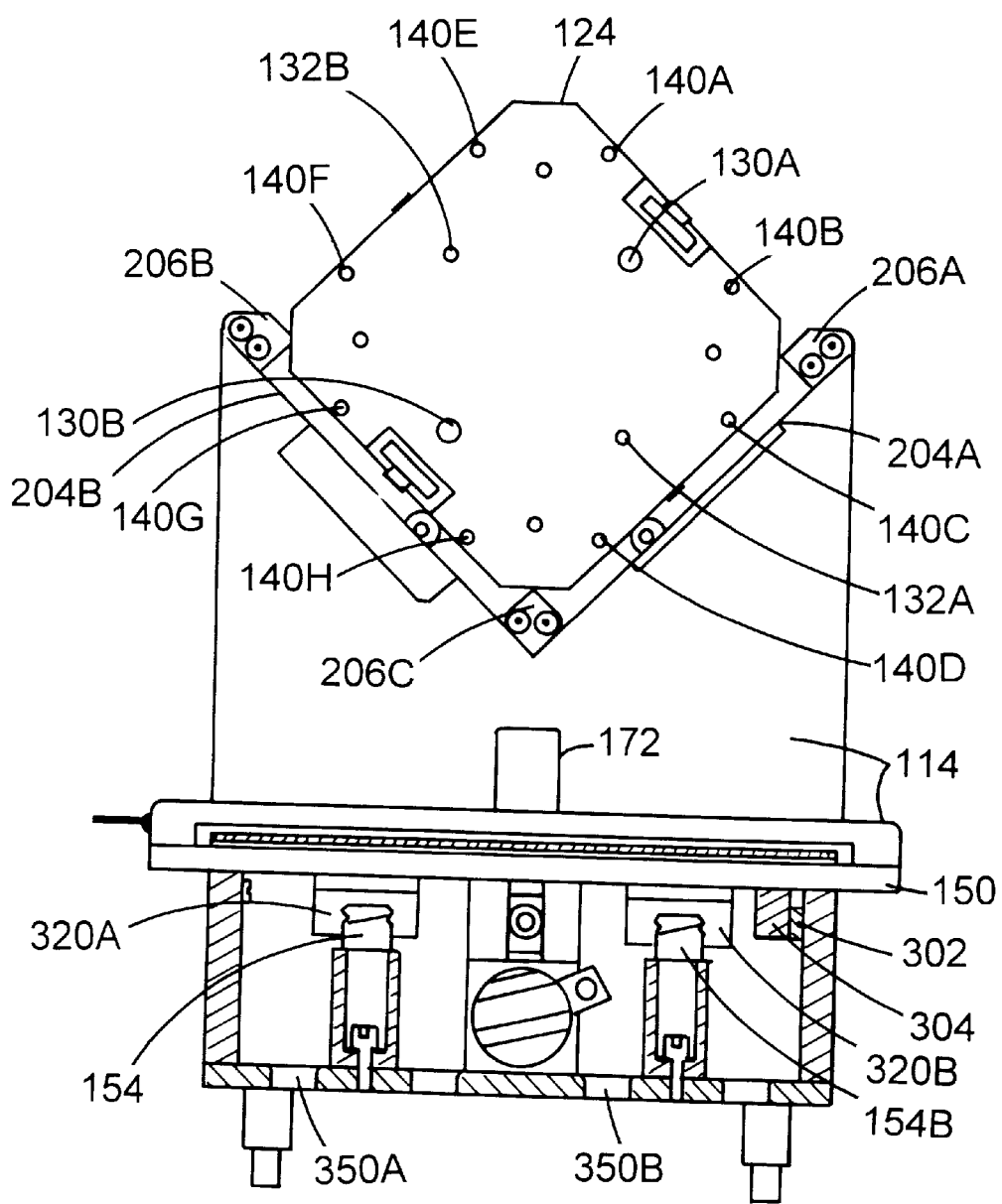
FIG. 3 is a sectional view showing a pellicle holder and pressure applicator assembly.

Referring to FIG. 3 and FIG. 1, spring plungers 130A, 130B are positioned to provide spring tension between the middle plate 122 and the back plate 120. Spring plungers 132A,132B are positioned to provide spring tension between front plate 120 and middle plate 122. Bottom plates 150 and 152 are attached to the lower sections of reticle holder 114 and pressure applicator brace 118 respectively. Bearing blocks 320A,320B are attached to bottom plates 150 and 152. Slide rails 154A,154B are attached to the lower section of base frame 102. The bearing blocks 320A,320B and slide rails 154A,154B allow for the reticle holder 114 and pressure applicator brace 118 to slide back and forth relative to the base frame and relative to the pellicle tray holder plate 110. Reticle holder 114 includes two stop blocks 170,172 fixed to the bottom of the reticle holder and in line to contact shock absorbers 180 and 182 respectively, as will be explained.

FIG. 2 shows another view of an embodiment from above the pellicle mounting apparatus 100 and includes cross-sectional references C—C, D—D, E—E. FIG. 3 shows the view C—C from FIG. 2, which is a cross-section of reticle holder 114. Referring to FIG. 2 and FIG. 3, reticle holder 114 includes reticle edge supports 204A,204B and reticle retaining clips 206A,206B rigidly attached to reticle holder 114 to form two grooves for supporting a reticle in a vertical position. Reticle retaining clip 206C rigidly attached to reticle holder 114 forms a pocket for supporting a corner of a reticle in a vertical position. Pressure applicator pins 140A–140-H are rigidly attached to the pressure applicator front plate 124.

Figure 5:
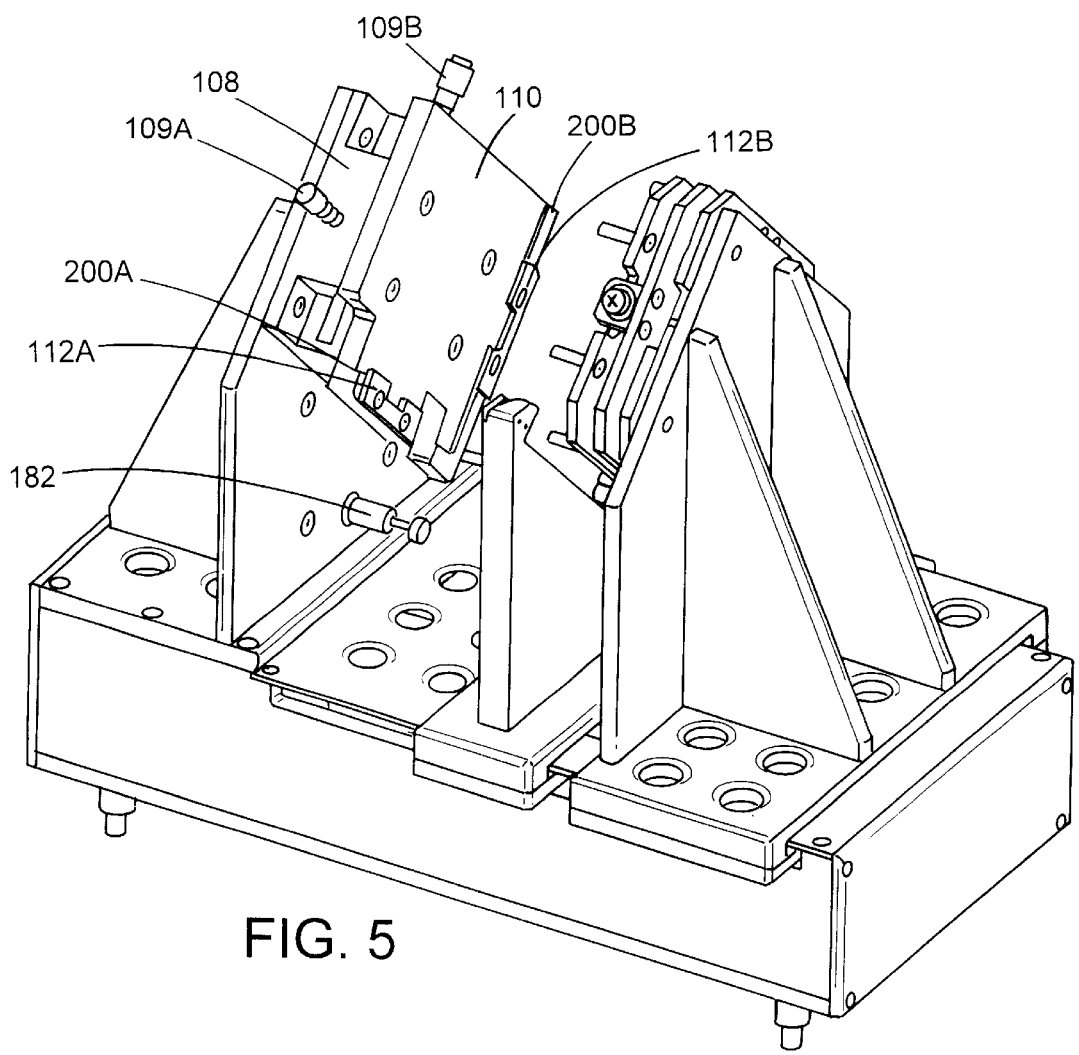
FIG. 5 is a side-angle view of an embodiment.

Referring to FIG. 4 and FIG. 5, pellicle tray holder plate 110 includes two pellicle tray edge supports 200A,200B and two pellicle tray retaining clips 112A,112B which are rigidly attached to pellicle tray holder 110 and form two grooves for supporting a pellicle tray in a vertical position.

Figure 6:
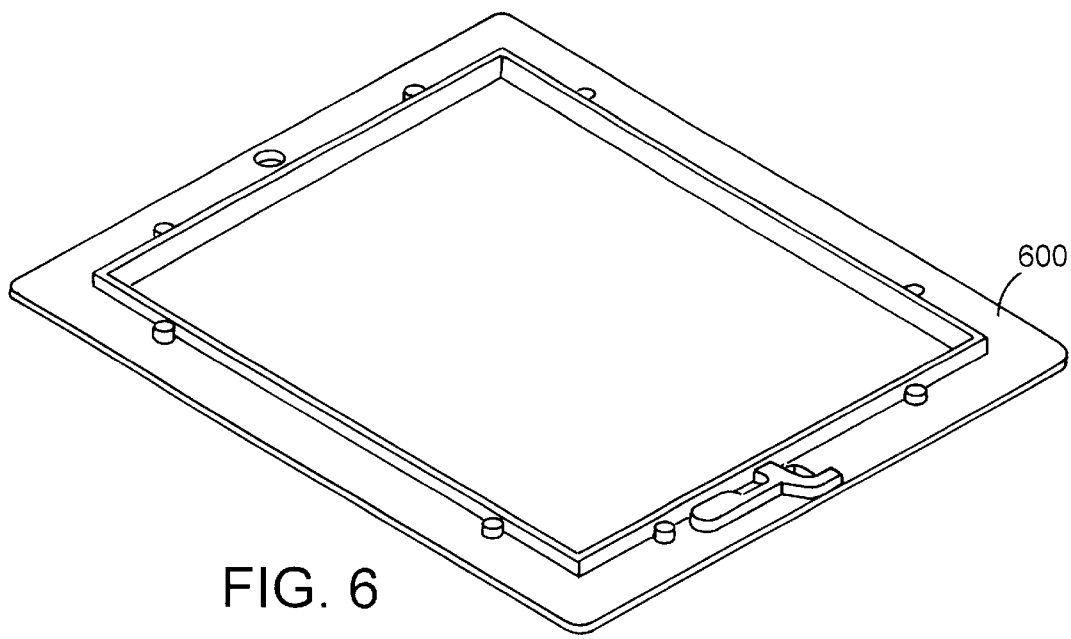
FIG. 6 is a perspective of a pellicle tray.

FIG. 6 shows a pellicle tray 600.

Figure 7:
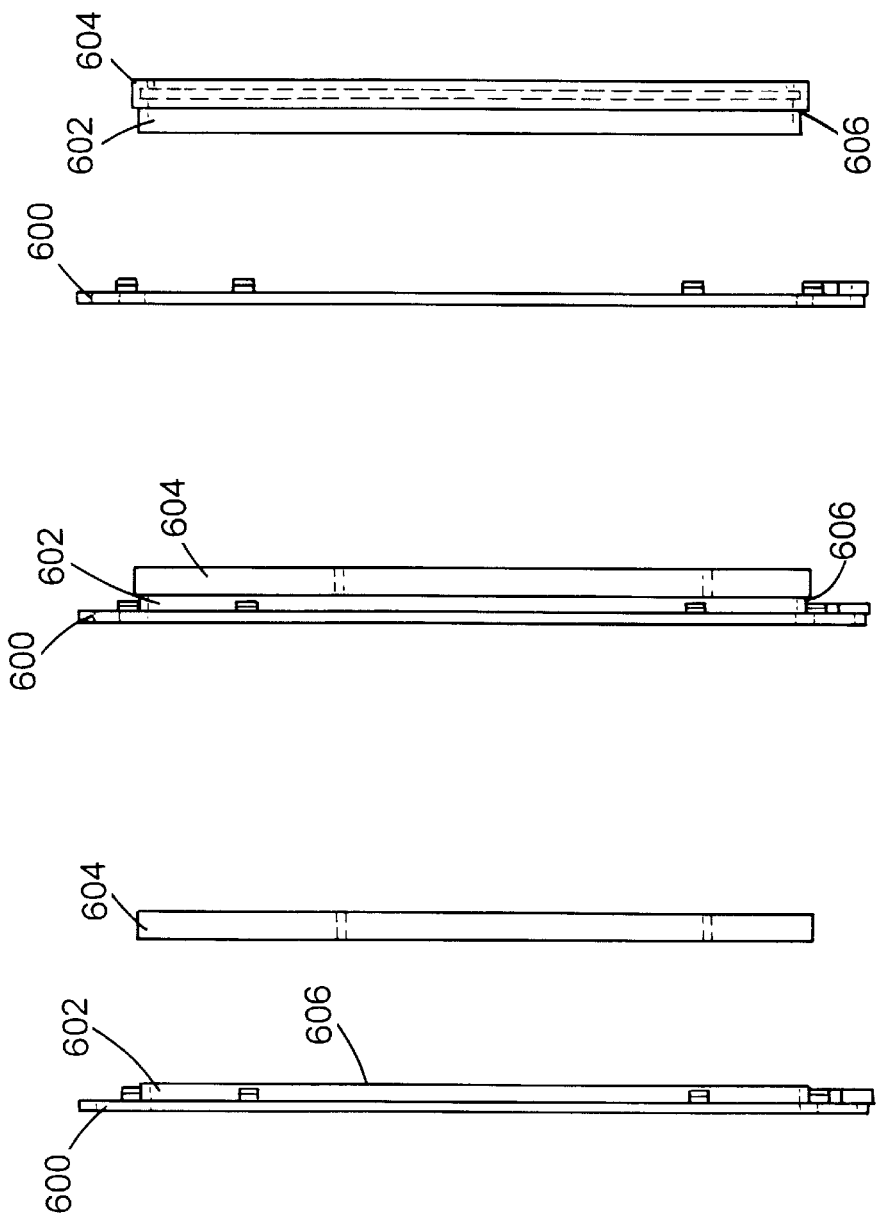
FIGS. 7A–7C are cross-sectional views of a pellicle tray, a pellicle frame and a reticle in un-assembled and assembled views.

FIGS. 7A–7C shows a pellicle tray 600, a framed pellicle 602 and a reticle 604 before assembly (FIG. 7A), during assembly (FIG. 7B) and after assembly and separation (FIG. 7C). The framed pellicle 602 includes a layer of adhesive material 606 on the surface of the framed pellicle 602.

In one embodiment, the pellicle tray holder is implemented to hold a pellicle tray, with a framed pellicle contained therein. The use of the pellicle tray, therefore, allows for a variety of pellicle frame sizes to be accommodated. In another embodiment, the pellicle tray holder could be implemented to hold the framed pellicle without the use of the pellicle tray.

Figure 8:
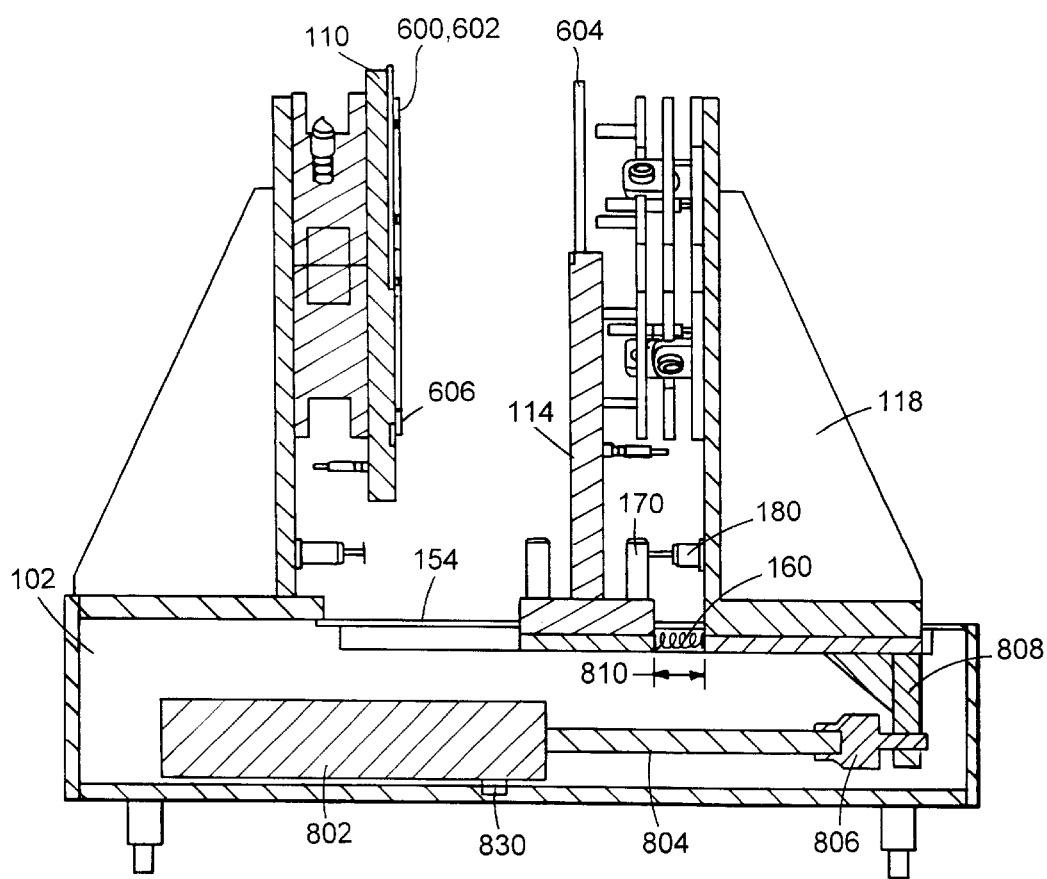
FIG. 8 is a sectional view of an embodiment in an "Open" position.

FIG. 8. shows a view of an embodiment in the "Open" position, with a reticle 604 loaded into reticle holder 114, and a pellicle tray 600 and framed pellicle 602 loaded into pellicle tray holderplate 110. The cut away view of base frame 102 shows hydraulic cylinder 802 connected to base frame 102 with attachment means 830. Attachment means 830 can be one or more pins, screws, or bolts to enable an essentially rigid connection for hydraulic cylinder 802 to the base frame 102. Piston rod 804 extends from cylinder 802 and is connected to pressure applicator brace 118 with coupling 806 and down rod 808. Retention spring 160 is attached to reticle holder 114 and pressure applicator brace 118.

Figure 9:
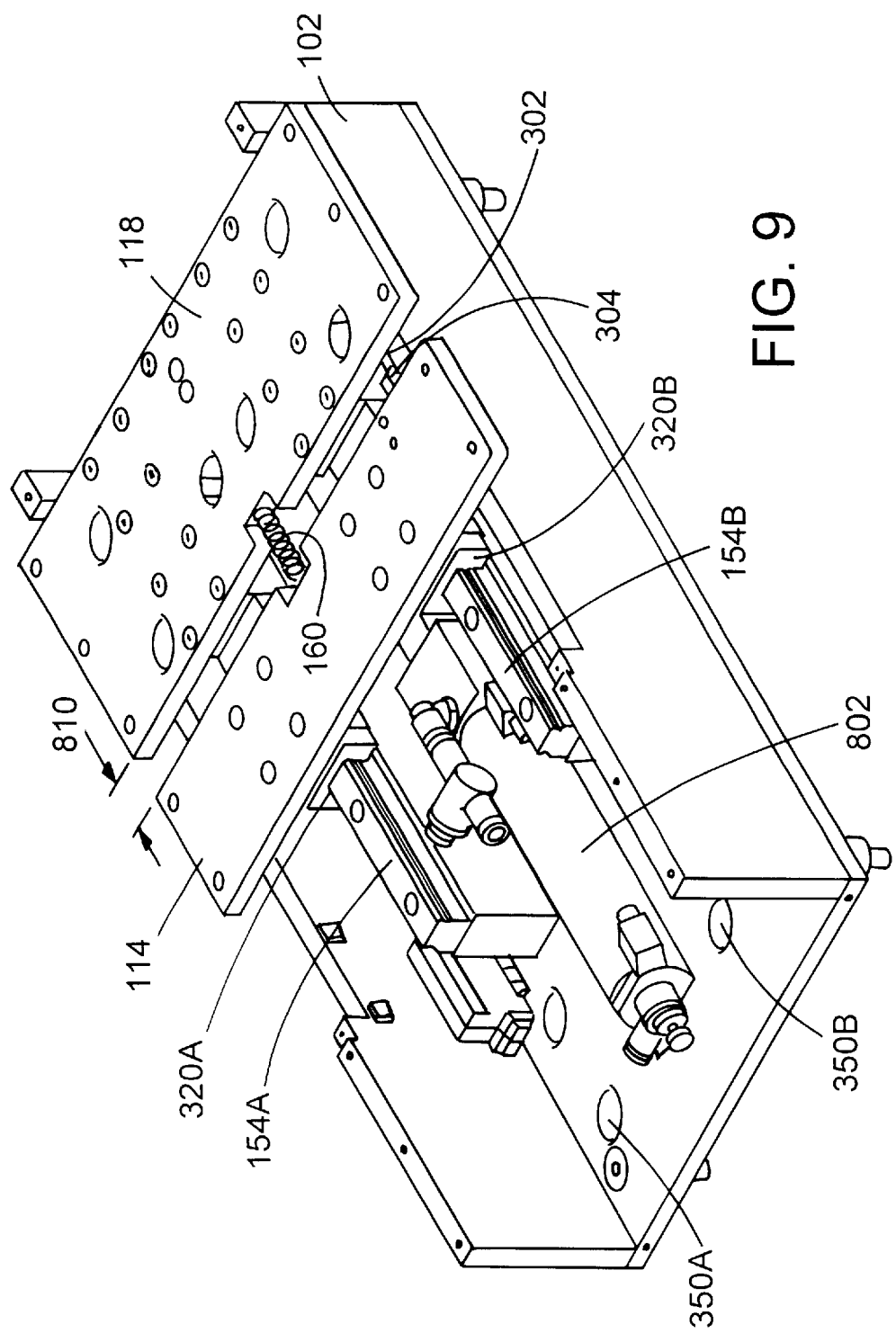
FIG. 9 is a cut-away sectional view of an embodiment in the "Open" position.

FIG. 9 shows a "cut off" view of an embodiment in the "Open" position. Reticle holder down tab 304 is rigidly attached to the bottom of bearing plate 150. Reticle holder stop block 302 is rigidly attached to base frame 102. In operation, pressure is applied to cylinder 802 extending piston rod 804 which pushes pressure applicator brace 118 to the "Open" position along guide rail 154. Retention spring 160 is stretched as pressure applicator brace 118 slides to the "Open" position while reticle holder 114 remains stationary due to down tab 304 coming into contact with stop block 302. As a result, a wider gap 810 is created between reticle holder 114 and pressure applicator brace 118. Flexible retention cable 210, shown in FIG. 2, is connected to both reticle holder 114 and pressure applicator 118. In operation, as cylinder 802 forces pressure applicator 118 away from reticle holder 114, flexible retention cable assists in preventing an over-extension of retention spring 160. Once in the "Open" position, a reticle 604 can be loaded into reticle holder 114 without interference from pressure applicator pins 140A–140H.

Figure 10:
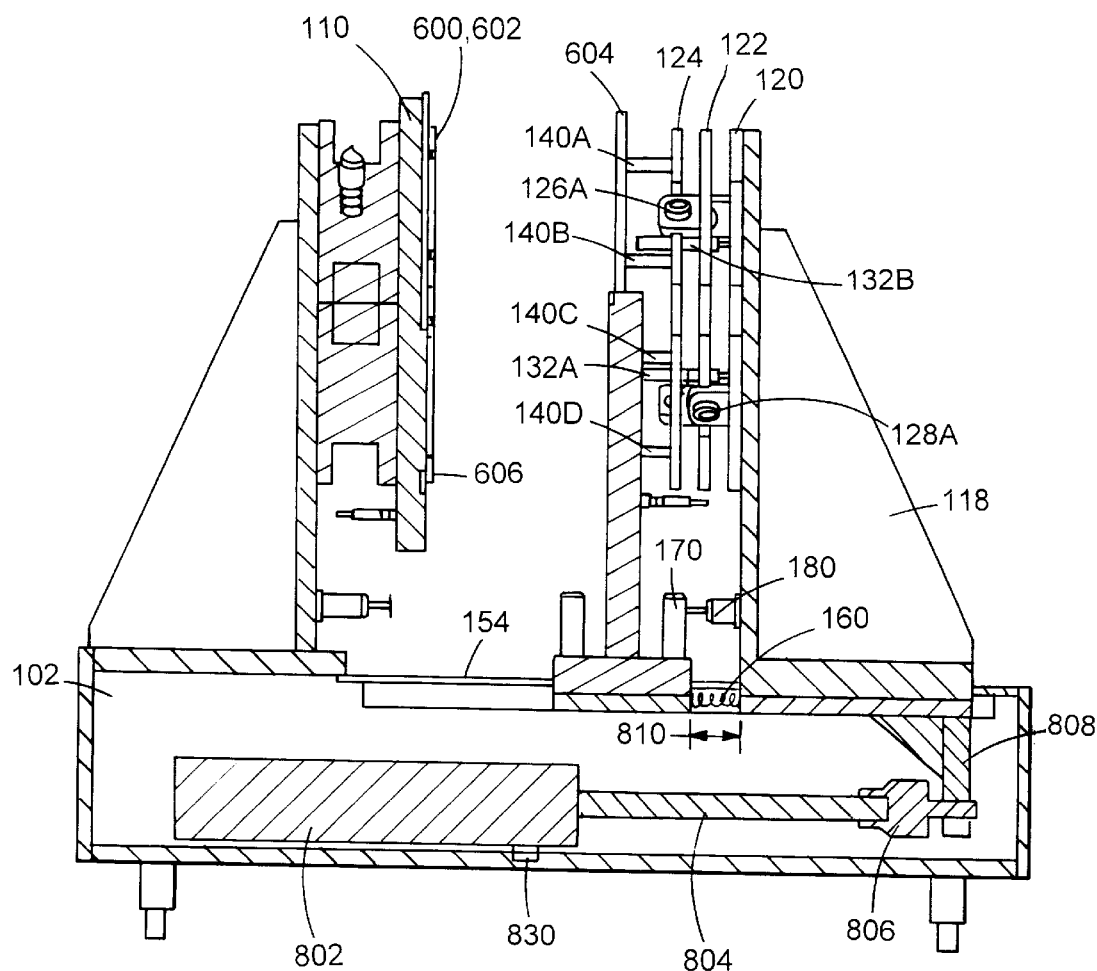
FIG. 10 is a sectional view of an embodiment in the "Support Contact" position.

FIG. 10 shows a view of invention in the "Support Contact" position. In operation, to achieve the "Support Contact" position from the "Open" position, pressure is released from cylinder 802, piston rod 804 retracts and pressure applicator brace 118 travels towards reticle holder 114. Pressure applicator brace 118 includes a shock absorber 180 attached near the bottom of brace 118 so that as the brace travels towards reticle holder 114, shock absorber 180 contacts stop block 170. The shock absorber reduces the initial impact of pressure applicator pins 140A–140H against the reticle 604 and allows a period of time for the pressure applicator pins to adjust in relation to the reticle and thereby allow an even application of pressure to the reticle. In the preferred embodiment, the pressure applicator, which includes the three pressure adjustment plates, provides a uniform application of pressure at the periphery of the reticle as the apparatus is brought into the "Support Contact" position. The combined effect of the pivoting plates and spring plungers is to allow the pressure applicator pins to adjust as contact as made with the reticle and allow all of the applicator pins to make contact with the reticle before any significant force is applied.

Figure 11:
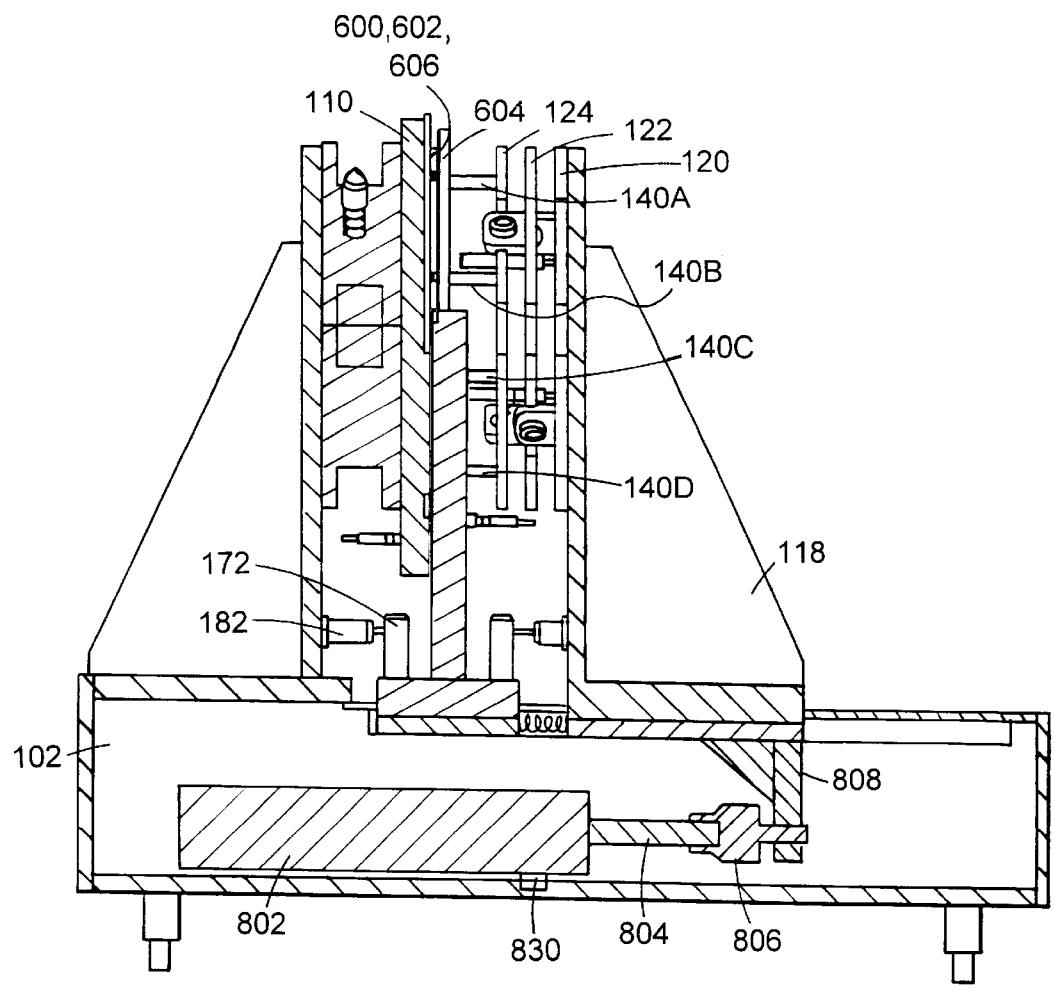
FIG. 11 is a sectional view of an embodiment in the "Closed" position.

FIG. 11 shows a view of invention in the "Closed" position. In operation, to achieve the "Closed" position from the "Support Contact" position, pressure is released from cylinder 802, piston rod 804 retracts causing pressure applicator brace 118, which is now in contact with reticle holder through shock absorber 180 and stop block 170, to slide along guide rail 154 towards pellicle tray holder 110. Next, shock absorber 182, mounted on pellicle tray holder 110 comes into contact with stop block 172 of reticle holder. Shock absorber 182 reduces the initial impact of the combined reticle holder 114 and pressure applicator brace 118 as it slides against pellicle frame holder 108 and the framed pellicle 602 and pellicle tray 600. In the "Closed" position pressure is maintained through pressure applicator brace 118, pressure applicator pins 140A–140H, reticle 604, adhesive layer 606, pellicle 602, pellicle frame 600 and against pellicle tray holder 110. The apparatus remains in the "Closed" position according to a user definable time interval. The time interval required is defined by the requirements of the adhesive applied to the reticle and/or pellicle. Once this time interval has passed the apparatus can return to the "Open" position by reversing the cylinder 802 to extend the piston rod 804 which allows for the removal of the pellicle tray 600, and reticle 602/framed pellicle package to be removed individually (as shown in FIG. 7C).

In one embodiment, the user can define the time interval for the apparatus to remain in the "Closed" position. In another embodiment, an external device can set the time interval. In another embodiment the time interval can be a fixed time period that is not adjustable.

The embodiments, as described above, provides for a simple yet efficient vertical mounting and support of a reticle and pellicle tray. The two edge supports of the holders provide mechanism for supporting each object below their center of gravity, without mechanical means. Therefore, the reticle and pellicle tray can be held vertically without the risk of distorting them before, during and after the mounting of the fragile reticle to the framed pellicle. Also, the vertical mounting fixtures provide a mechanism for simple loading and un-loading of the pellicle tray, framed pellicle, reticle and final assembled parts.

Referring to FIG. 4 and FIG. 1, adjustment means 109A, 109B allow the pellicle tray holder plate 110 to be translated in two planes relative to the upright portion of pellicle holder brace 104. With the pellicle mounting apparatus at or near the "Closed" position, an operator can adjust the position of pellicle holder plate 110 relative to the to the reticle holder 114 and a reticle 604 (if loaded). The adjustment means 109A, 109B together with the mounting of the pellicle holder plate 110 in relation to the reticle holder 114, allow for finely tunable adjustment which is maintainable through repeated mounting operations.

Referring again to FIG. 2, exemplary air flow holes are shown, including top frame air flow hole 220 and holder air flow hole 222. Referring to FIG. 3, additional exemplary air flow holes are shown, specifically bottom frame air flow holes 350A,350B. The exemplary air flow holes represent a multiplicity of air flow holes in the top frame, bottom frame and holders. The combined effect of using vertical mounting fixtures along with the exemplary air flow holes is to allow for an airflow to be applied vertically past the reticle and framed pellicle during the assembly process. The air source may be provided by a laminar air flow chamber. The vertical air flow provides a benefit of reducing the framed pellicle and reticle to contaminant exposure during assembly.

Referring again to FIG. 1, holder full sensors 190A, 190B, are mounted on reticle holder 114 and pellicle holder brace 104, respectively. Sensors 190A, 190B can be utilized in an automated assembly process to detect the presence or absence of a framed pellicle or reticle to assure that the mounting operation does not occur until both elements are present in the apparatus. Examples of sensors 190A, 190B include retroflective light sensors which reflecting a light source at a location and use the reflected light information to determine the presence of absence in that location.

In an alternative embodiment, a mechanical sensor, or sensors, could be used to detect the absence or presence of an object in the reticle holder or the pellicle tray holder. For example, a weight sensor could be used.

In another embodiment, the role of each of the holders could be reversed. That is the the first holder (the reticle holder as described above) and the second holder (the pellicle tray holder as described above) could each be used to hold either a reticle or pellicle. The operation of the machine would remain essentially the same, with the pressure applicator contacting the object held in the first holder first, then apply pressure through the first object to the second object held in the second holder. In another embodiment, both the second holder could also be slidably coupled to the frame.

Cylinder 802 can be implemented as a hydraulic cylinder or a pneumatic cylinder.

A number of embodiments of an embodiment have been described. Nevertheless, it will be understood that various modifications may be made without departing from the spirit and scope of an embodiment. Accordingly, other embodiments are within the scope of the following claims.

What is claimed is:

1. An apparatus for mounting a pellicle to a reticle, the apparatus comprising:
    a base;
    a first holder coupled to the base and comprising two edges positioned to support a first object below its center of gravity and secure the first object in substantially vertical alignment with the base, the first object comprising one of the pellicle and the reticle;
    a second holder slidably coupled to the base and comprising two edges positioned to support a second object below its center of gravity and secure the second object in substantially vertical alignment with the base, the second object comprising the other of the pellicle and the reticle; and
    a pressure applicator assembly slidably coupled to the base to adjustably apply pressure to a periphery of the second object held in the second holder and drive it against a corresponding periphery of the first object held in the first holder.

2. The apparatus of claim 1, wherein the first object comprises a pellicle tray supporting the pellicle.

3. The apparatus of claim 1, wherein the first object is the pellicle.

4. The apparatus of claim 1, wherein the first holder is rigidly coupled to the base and comprises a backing plate positioned to support a back periphery of the first object.

5. The apparatus of claim 1, wherein the first holder is slidably coupled to the base, and the apparatus further comprises a backing plate rigidly secured to the base and extending substantially vertically from the base, the backing plate being configured to support a back periphery of the first object.

6. The apparatus of claim 4 wherein the first holder further comprises:
    an upright bracket coupled to the base; and
    a translation frame rigidly coupled to the upright bracket and to the backing plate, the translation frame configured to allow adjustment of the backing plate in a substantially vertical plane relative to the base.

7. The apparatus of claim 1 wherein the pellicle includes an adhesive along the periphery of one face of the pellicle.

8. The apparatus of claim 1, further comprising a bi-directional actuator coupled to the pressure applicator assembly to drive and retract the pressure applicator assembly in relation to the base.

9. The apparatus of claim 8, wherein during operation the actuator drives the pressure applicator assembly against the second object to cause the second holder to slide towards the first holder.

10. An automated apparatus for mounting a pellicle to a reticle, the apparatus comprising:
    a base;
    a first holder coupled to the base and positioned to support a first object in substantially vertical alignment to the base, the first object comprising one of the pellicle and the reticle, the first holder comprising at least one sensor for determining the presence or absence of the first object in the first holder;
    a second holder slidably coupled to the base and positioned to support a second object in substantially vertical alignment with the base, the second object comprising the other of the pellicle and the reticle, the second holder comprising at least one sensor for determining the presence or absence of the second object in the second holder;
    a pressure applicator assembly slidably coupled to the base to adjustably apply pressure to a periphery of the second object held in the second holder and drive it against a corresponding periphery of the first object held in the first holder; and
    an actuator coupled to the pressure applicator assembly and responsive to the sensors in the first and second holder to drive the pressure applicator assembly towards the first holder for a time interval when the first and second object are in the first and second holders.

11. The apparatus of claim 10, wherein the first object comprises a pellicle tray supporting the pellicle.

12. The apparatus of claim 10, wherein the sensors comprise retroflective light sensors.

13. The apparatus of claim 10, wherein the sensors comprise mechanical sensors.

14. The apparatus of claim 10, wherein the time interval is controllable by a user.

15. The apparatus of claim 10, further comprising a controller coupled to the actuator to set the time interval.

16. The apparatus of claim 10, wherein during operation the actuator retracts the pressure applicator assembly away from the first holder after the time interval.

17. The apparatus of claim 10, wherein the actuator is a bi-directional cylinder configured to drive the pressure applicator assembly towards the first holder and alternately to retract the pressure applicator assembly away from the first holder.

18. The apparatus of claim 17, wherein the cylinder is a pneumatic cylinder.

19. The apparatus of claim 10 further comprising a shock absorber coupled to at least one of the pressure applicator and the second holder and positioned between the pressure applicator and the second holder.

20. The apparatus of claim 10 further comprising a shock absorber coupled to at least one of the first holder and the second holder and positioned between the first holder and the second holder.

21. An apparatus for mounting a pellicle to a reticle, the apparatus comprising:

a base;

a first holder coupled to the base and positioned to support a first object in substantially vertical alignment to the base, the first object comprising one of the pellicle and the reticle;

a second holder slidably coupled to the base and positioned to support a second object in substantially vertical alignment with the base, the second object comprising the other of the pellicle and the reticle; and a pressure applicator assembly slidably coupled to the base to adjustably apply pressure to a periphery of the second object held in the second holder and drive it against a corresponding periphery of the first object in the first holder, wherein the pressure applicator assembly comprises:

a slidable bracket coupled to the base;

a back plate rigidly attached to the slidable bracket;

an intermediate plate pivotally coupled to the back plate along at least one axis; and a front plate pivotally coupled to the intermediate plate along at least one other axis, the front plate having a plurality of contact points configured to align with the periphery of the second object held in the second holder.

22. The apparatus of claim 21, wherein the pressure applicator assembly further comprise a first at least one tensioning device positioned to apply tension to the pivotal coupling between the back plate and the intermediate plate, and a second at least one tensioning device positioned to apply tension to the pivotal coupling between the front plate and the intermediate plate.

23. The apparatus of claim 22, wherein the first and second tensioning devices comprise a plurality of springs.

24. The apparatus of claim 21, wherein the pressure applicator assembly is configured to adjust to the orientation of the periphery of the second object and apply uniform pressure to the periphery of the second object.

25. An apparatus for mounting a pellicle to a reticle, the apparatus comprising:

a base;

a first holder coupled to the base and positioned to support a first object in substantially vertical alignment to the base, the first object comprising one of the pellicle and the reticle;

a second holder slidably coupled to the base and positioned to support a second object in substantially vertical alignment with the base, the second object comprising the other of the pellicle and the reticle;

a pressure applicator assembly slidably coupled to the base to adjustably apply pressure to a periphery of the second object held in the second holder and drive it against a corresponding periphery of the first object held in the first holder; and a laminar air flow source configured to provide air flow along the substantially vertically aligned first and second objects.

* * * * *